US012660106B2

(12) United States Patent
Tan

(10) Patent No.: US 12,660,106 B2
(45) Date of Patent: Jun. 16, 2026

(54) EMERGENCY POWER SUPPLY FOR UFO HIGHBAY LIGHT

(71) Applicant: Dongguan Haiyue Intelligent Technology Co.,Ltd, Dongguan (CN)

(72) Inventor: Huishi Tan, Shenzhen (CN)

(73) Assignee: Dongguan Haiyue Intelligent Technology Co., Ltd, Dongguan (CN)

( * ) Notice: Subject to any disclaimer, the term of this patent is extended or adjusted under 35 U.S.C. 154(b) by 111 days.

(21) Appl. No.: 18/924,059

(22) Filed: Oct. 23, 2024

(65) Prior Publication Data

US 2026/0055863 A1 Feb. 26, 2026

(30) Foreign Application Priority Data

Aug. 22, 2024 (CN) .......................... 202422050895.1

(51) Int. Cl.
 *H05K 5/02* (2006.01)
 *F21V 23/02* (2006.01)
 *F21S 8/06* (2006.01)
(52) U.S. Cl.
 CPC ........... *H05K 5/0217* (2013.01); *F21V 23/02* (2013.01); *F21S 8/06* (2013.01)
(58) Field of Classification Search
 CPC ....... F21V 23/02; H05K 5/0217; H05K 7/142
 See application file for complete search history.

(56) References Cited

U.S. PATENT DOCUMENTS

| | | | | |
|---|---|---|---|---|
| 9,803,839 | B2 * | 10/2017 | Visser | F21V 21/30 |
| 10,302,283 | B2 * | 5/2019 | Moon | F21V 21/03 |
| 11,333,333 | B1 * | 5/2022 | Hwang | F21S 9/037 |
| 11,540,374 | B1 * | 12/2022 | Tan | F21V 1/143 |
| 12,385,625 | B1 * | 8/2025 | Hwang | F21V 23/04 |
| 12,504,158 | B1 * | 12/2025 | Tan | F21V 23/023 |
| 2011/0013398 | A1 * | 1/2011 | Chien | F21V 29/00 |
| | | | | 362/249.06 |
| 2020/0318825 | A1 * | 10/2020 | Jiang | F21V 29/83 |
| 2021/0080084 | A1 * | 3/2021 | Danesh | F21V 15/01 |
| 2022/0082233 | A1 * | 3/2022 | Kopitzke | F21V 17/164 |
| 2022/0316850 | A1 * | 10/2022 | Kang | G01B 3/1041 |
| 2023/0211037 | A1 * | 7/2023 | Lan | F21V 33/0088 |
| | | | | 422/22 |
| 2024/0426441 | A1 * | 12/2024 | Pyshos | F21V 23/045 |

FOREIGN PATENT DOCUMENTS

| | | |
|---|---|---|
| CN | 109640487 A | 4/2019 |
| CN | 213214048 U | 5/2021 |
| CN | 220453598 U | 2/2024 |

* cited by examiner

*Primary Examiner* — Sagar Shrestha
(74) *Attorney, Agent, or Firm* — Nitin Kaushik

(57) ABSTRACT

Disclosed in the present utility model is an emergency power supply for a UFO highbay light, including a power supply housing that is in an annular structure and is provided with a first notch at a top and a first mounting groove in an annular structure at a bottom, where two first spacer plates are further disposed in the first mounting groove at an interval; a first mounting compartment in an arc-shaped structure is defined between the two first spacer plates, and a printed circuit board (PCB) is further mounted in the first mounting compartment; and a second mounting compartment in an arc-shaped structure is defined between one of the first spacer plates and an inner wall of one end of the first notch, and a battery connected to the PCB is further mounted in the second mounting compartment.

8 Claims, 4 Drawing Sheets

EMERGENCY POWER SUPPLY FOR UFO HIGHBAY LIGHT

CROSS-REFERENCE TO RELATED APPLICATIONS

The application claims priority to Chinese patent application No. 2024220508951, filed on Aug. 22, 2024, the entire contents of which are incorporated herein by reference.

TECHNICAL FIELD

The present utility model relates to the technical field of power supplies for lights, in particular to an emergency power supply for a UFO highbay light.

BACKGROUND

At present, the commonly used power supply for a UFO highbay light is a driving power supply commonly used on the market, which is mounted on the light through mounting holes in the power supply. However, the market has also put forward some new requirements for the whole power supply for the light after mounting, for example, there is a need for emergency, wireless Bluetooth and other functions. These additional functions can only be achieved by adding corresponding functional products separately. This will destroy the original structure of the light, resulting in high costs, troublesome mounting, scattered wires, and inconvenient arrangement.

SUMMARY

An objective of the present utility model is to provide an emergency power supply for a UFO highbay light. The emergency power supply is provided with fixing holes in a power supply housing, can be mounted in an alignment and matching manner by direct use of original screw holes in the UFO highbay light, and is fast to mount and convenient to disassemble and maintain; meanwhile, the fixing holes are designed to be of a long arc-shaped structure, which can be compatible with most of UFO highbay lights on the market, thereby achieving strong universality; in addition, an infrared receiver and a Bluetooth antenna are further integrated, which can implement a remote intelligent control function of a terminal, thereby achieving high practicality.

To achieve the above objective, the following technical solution is adopted:

An emergency power supply for a UFO highbay light, including:

a power supply housing that is in an annular structure and is provided with a first notch at a top and a first mounting groove in an annular structure at a bottom, where two first spacer plates are further disposed in the first mounting groove at an interval; a first mounting compartment in an arc-shaped structure is defined between the two first spacer plates, and a printed circuit board (PCB) is further mounted in the first mounting compartment; a second mounting compartment in an arc-shaped structure is defined between one of the first spacer plates and an inner wall of one end of the first notch, and a battery connected to the PCB is further mounted in the second mounting compartment; a wiring compartment in an arc-shaped structure is defined between the other spacer plate and an inner wall of the other end of the first notch; and the wiring compartment is provided with a first wiring hole, and the first spacer plate is further provided with a first wire hole; and a power supply cover plate that is connected to the bottom of the power supply housing and seals the first mounting groove; where an outer wall of the power supply housing is further provided with first fixing strips in a manner of extending outwards, and the first fixing strips are provided with first fixing holes.

Further, the first fixing holes are in an arc structure.

Further, the emergency power supply for a UFO highbay light further includes a wiring cover plate, where a part of the top of the power supply housing corresponding to the wiring compartment is further provided with a first wiring opening, and the wiring cover plate is mounted on the first wiring opening and seals the wiring compartment; and the first wiring hole is formed in the wiring cover plate.

Further, an inner wall of one side of the first mounting compartment is further connected to two first clamping blocks arranged at an interval; one opposite sides of the two first clamping blocks is each provided with a limiting clamping groove along a vertical direction; and two ends of the PCB are each clamped in the limiting clamping groove.

Further, an outer wall of one end of the first notch is further mounted with a Bluetooth antenna connected to the PCB.

Further, an outer wall of the other end of the first notch is further mounted with an infrared receiver and an indicator light button that are connected to the PCB.

Further, the first wiring opening is further embedded with a first waterproof gasket.

Further, a bottom of the first mounting groove is further connected to a second waterproof gasket.

With the above solution, the present utility model has the following beneficial effects:

According to the present utility model, the emergency power supply is provided with the fixing holes in the power supply housing, can be mounted in an alignment and matching manner by direct use of original screw holes in the UFO highbay light, and is fast to mount and convenient to disassemble and maintain; meanwhile, the fixing holes are designed to be of a long arc-shaped structure, which can be compatible with most of UFO highbay lights on the market, thereby achieving strong universality; in addition, an infrared receiver and a Bluetooth antenna are further integrated, which can implement a remote intelligent control function of a terminal, thereby achieving high practicality.

Figure 1:
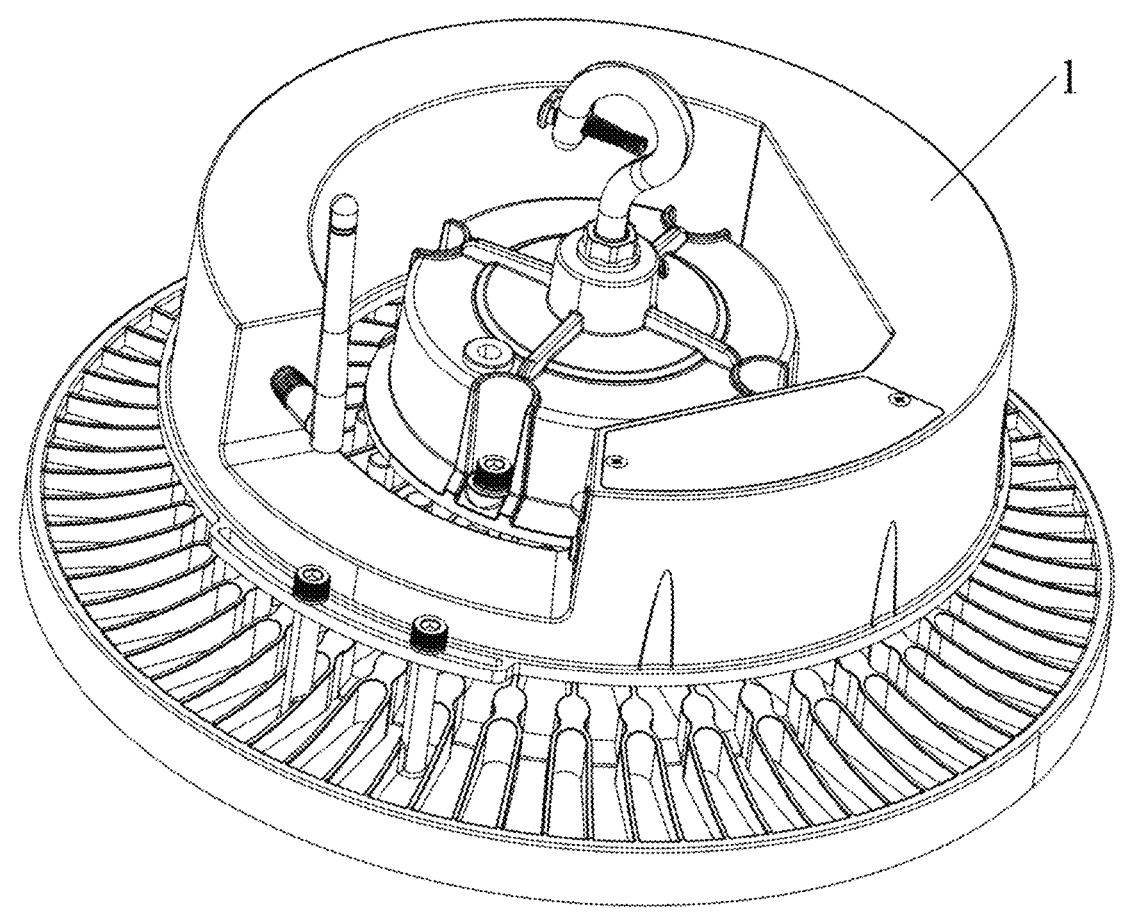
FIG. 1 is a schematic structural diagram of the present utility model mounted on a UFO highbay light in an embodiment.
Figure 2:
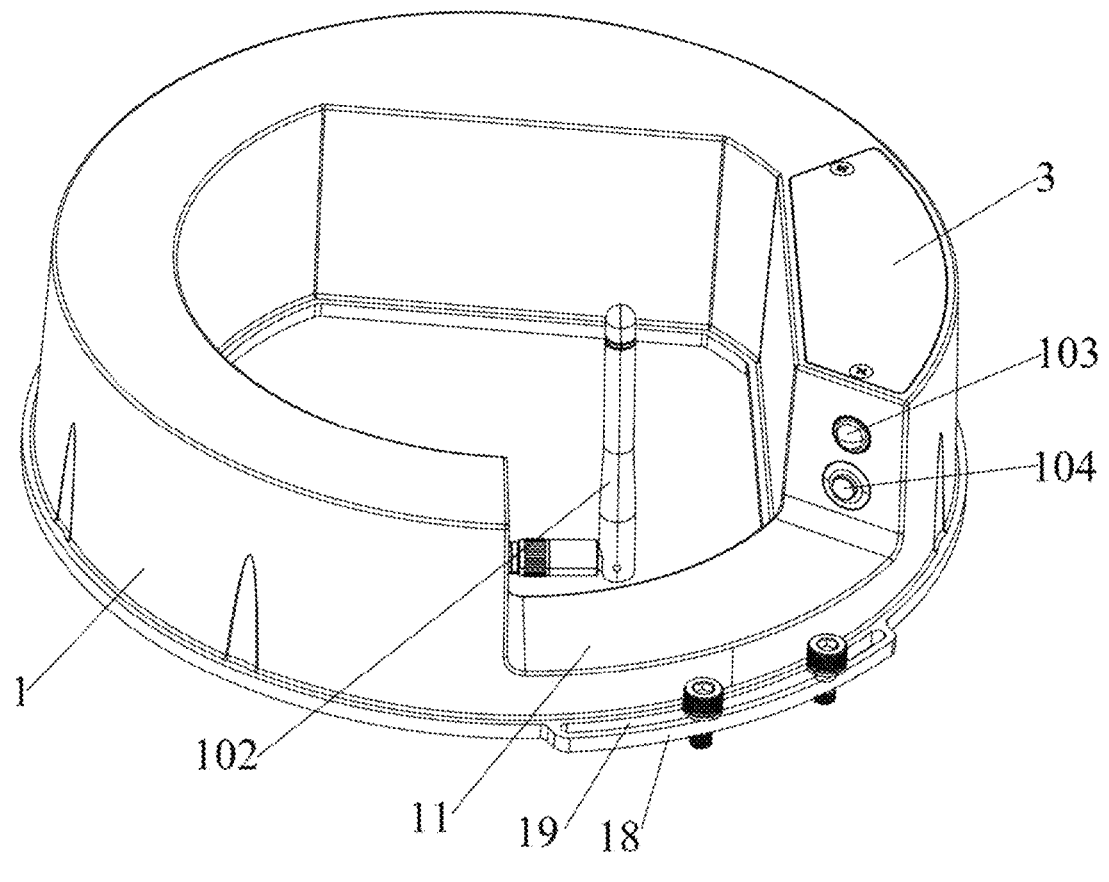
FIG. 2 is a schematic structural diagram of the present utility model.
Figure 3:
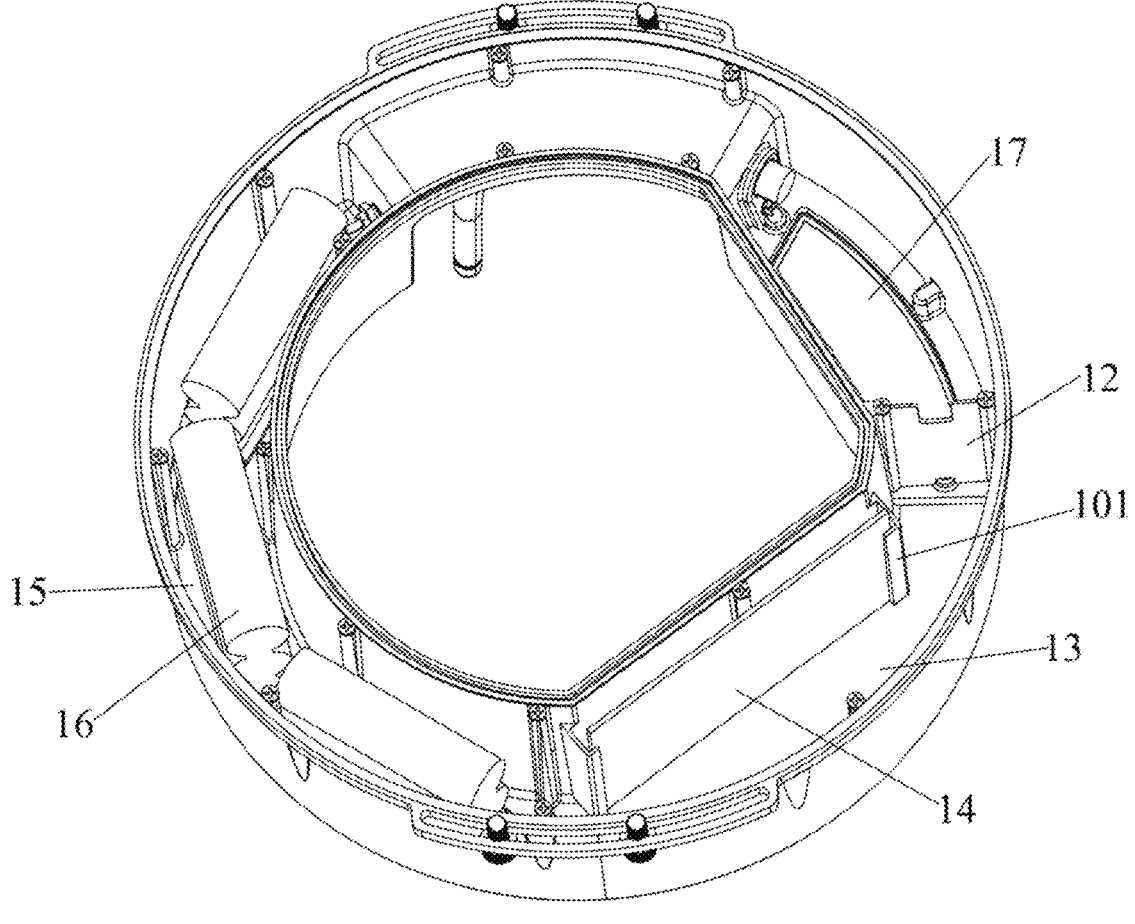
FIG. 3 is a schematic structural diagram of the present utility model free of a power supply cover plate.
Figure 4:
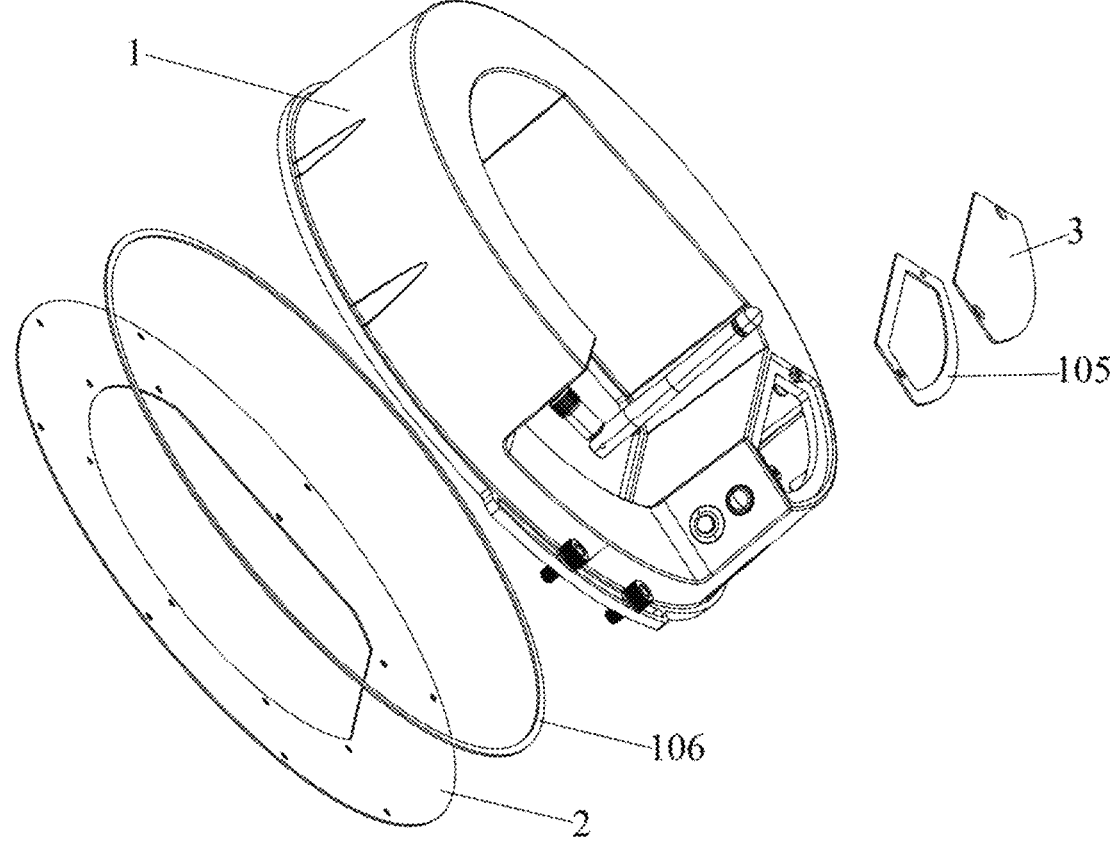
FIG. 4 is an exploded view of the present utility model.

DESCRIPTION OF REFERENCE SIGNS 1. power supply housing; 2. power supply cover plate; 3. wiring cover plate; 101. first clamping block; 102. Bluetooth antenna; 103. infrared receiver; 104. indicator light button; 105. first waterproof gasket; 106. second waterproof gasket; 11. first notch; 12. first spacer plate; 13. first mounting compartment; 14. PCB;

15. second mounting compartment; 16. battery; 17. wiring compartment; 18. first fixing strip; and 19. first fixing hole.

DETAILED DESCRIPTION OF THE EMBODIMENTS

The present utility model is described in detail below in conjunction with the accompanying drawings and specific embodiments.

Referring to FIGS. 1 to 4, the present utility model provides an emergency power supply for a UFO highbay light, in an embodiment, including:

a power supply housing 1, where the power supply housing 1 is in an annular structure, and a top of the power supply housing 1 is further provided with a first notch 11 at a top; a bottom of the power supply housing 1 is provided with a first mounting groove in an annular structure, and two first spacer plates 12 are further disposed in the first mounting groove at an interval; a first mounting compartment 13 in an arc-shaped structure is defined between the two first spacer plates 12, and a PCB 14 is further mounted in the first mounting compartment 13; a second mounting compartment 15 in an arc-shaped structure is defined between one of the first spacer plates 12 and an inner wall of one end of the first notch 11, and a battery 16 connected to the PCB 14 is further mounted in the second mounting compartment 15; a wiring compartment 17 in an arc-shaped structure is defined between the other spacer plate 12 and an inner wall of the other end of the first notch 11; and the wiring compartment 17 is provided with a first wiring hole, and the first spacer plate 12 is further provided with a first wire hole; and a power supply cover plate 2, where the power supply cover plate 2 is connected to the bottom of the power supply housing 1 and seals the first mounting groove; where an outer wall of the power supply housing 1 is further provided with first fixing strips 18 in a manner of extending outwards, and the first fixing strips 18 are provided with first fixing holes 19.

Continuously referring to FIG. 1, during mounting of the emergency power supply, the power supply housing 1 can be directly arranged at a top of the existing UFO highbay light, so that the first fixing holes 19 are aligned with screw holes reserved in the light; and then, screws can be locked in the first fixing holes 19. The emergency power supply is convenient and fast to mount. In this embodiment, the power supply housing 1 is in the annular structure. During mounting of the emergency power supply, a driving power supply on the light can be placed in a central through hole of the power supply housing 1, which can save mounting space and improve the structural compactness. Meanwhile, the wiring compartment 17 is disposed in the power supply housing 1, and the wiring compartment 17 is provided with the first wiring hole, which can facilitate wiring with the light; and some wires can be placed in the wiring compartment 17 for easy arrangement. In addition, the battery 16 and the PCB 14 are further disposed in the power supply housing 1, which can provide emergency power supply to the light in case of abnormal power failure, thereby improving the satisfaction of using the light.

In an embodiment, the first fixing holes 19 are in an arc structure. In this embodiment, the outer wall of the power supply housing 1 is further provided with the two first fixing strips 18 in a manner of extending outwards, the two first fixing strips 18 are opposite to each other and are in an arc structure, and the first fixing holes 19 are also designed to be of a long arc-shaped structure, which can be compatible with most of UFO highbay lights on the market, thereby achieving strong universality.

In an embodiment, the emergency power supply for a UFO highbay light further includes a wiring cover plate 3; a part of the top of the power supply housing 1 corresponding to the wiring compartment 17 is further provided with a first wiring opening, and the wiring cover plate 3 is mounted on the first wiring opening and seals the wiring compartment 17; the first wiring hole is formed in the wiring cover plate 3; an inner wall of one side of the first mounting compartment 13 is further connected to two first clamping blocks 101; the two first clamping blocks 101 are arranged at an interval, and one opposite sides of the two first clamping blocks 101 is each provided with a limiting clamping groove along a vertical direction; and two ends of the PCB 14 are each clamped in the limiting clamping groove. End parts of the two ends of the PCB 14 are each clamped in the limiting clamping groove, which can improve the mounting stability thereof.

In an embodiment, an outer wall of one end of the first notch 11 is further mounted with a Bluetooth antenna 102 connected to the PCB 14. In this embodiment, the Bluetooth antenna 102 is arranged in the first notch 11, which can further reduce the mounting space and improve the structural compactness. Meanwhile, the Bluetooth antenna 102 can receive a Bluetooth signal and can be remotely controlled to work by a device supporting a Bluetooth function (e.g., a mobile phone), thereby improving the convenience in use of the product. Besides, an outer wall of the other end of the first notch 11 is further mounted with an infrared receiver 103 and an indicator light button 104 that are connected to the PCB 14. The infrared receiver 103 can receive an infrared signal and can be remotely controlled to work by a remote controller with an infrared function. Meanwhile, the indicator light button 104 is provided, which can display a working state of the power supply to the outside. Various control modes such as a Bluetooth control mode and an infrared control mode are provided and can be selected by a user according to usage requirements, thereby improving the universality of the product in use.

In an embodiment, the first wiring opening is further embedded with a first waterproof gasket 105. The first waterproof gasket 105 can prevent water from entering the wiring compartment 17, thereby avoiding affecting normal use of the power supply due to short circuit caused by water ingress. Moreover, a bottom of the first mounting groove is further connected to a second waterproof gasket 106. The second waterproof gasket 106 can prevent the water from entering the power supply housing 1, thereby improving the waterproof performance of the power supply, and extending the service life of the product.

The above are only preferred embodiments of the present utility model and are not used to limit the present utility model. Any modifications, equivalent substitutions and improvements, etc. made within the spirit and principle of the present utility model shall be included within the scope of protection of the present utility model.

What is claimed is:

1. An emergency power supply for a UFO highbay light, comprising:

a power supply housing that is in an annular structure and is provided with a first notch at a top and a first mounting groove in an annular structure at a bottom, wherein two first spacer plates are further disposed in the first mounting groove at an interval; a first mounting compartment in an arc-shaped structure is defined between the two first spacer plates, and a printed circuit board (PCB) is further mounted in the first mounting compartment; a second mounting compartment in an arc-shaped structure is defined between one of the first spacer plates and an inner wall of one end of the first notch, and a battery connected to the PCB is further mounted in the second mounting compartment; a wiring compartment in an arc-shaped structure is defined between the other spacer plate and an inner wall of the other end of the first notch; and the wiring compartment is provided with a first wiring hole, and the first spacer plate is further provided with a first wire hole; and a power supply cover plate that is connected to the bottom of the power supply housing and seals the first mounting groove; wherein an outer wall of the power supply housing is further provided with first fixing strips in a manner of extending outwards, and the first fixing strips are provided with first fixing holes.

2. The emergency power supply for a UFO highbay light according to claim 1, wherein the first fixing holes are in an arc structure.

3. The emergency power supply for a UFO highbay light according to claim 1, further comprising a wiring cover plate, wherein a part of the top of the power supply housing corresponding to the wiring compartment is further provided with a first wiring opening, and the wiring cover plate is mounted on the first wiring opening and seals the wiring compartment; and the first wiring hole is formed in the wiring cover plate.

4. The emergency power supply for a UFO highbay light according to claim 1, wherein an inner wall of one side of the first mounting compartment is further connected to two first clamping blocks arranged at an interval; one opposite sides of the two first clamping blocks is each provided with a limiting clamping groove along a vertical direction; and two ends of the PCB are each clamped in the limiting clamping groove.

5. The emergency power supply for a UFO highbay light according to claim 1, wherein an outer wall of one end of the first notch is further mounted with a Bluetooth antenna connected to the PCB.

6. The emergency power supply for a UFO highbay light according to claim 5, wherein an outer wall of the other end of the first notch is further mounted with an infrared receiver and an indicator light button that are connected to the PCB.

7. The emergency power supply for a UFO highbay light according to claim 3, wherein the first wiring opening is further embedded with a first waterproof gasket.

8. The emergency power supply for a UFO highbay light according to claim 1, wherein a bottom of the first mounting groove is further connected to a second waterproof gasket.

* * * * *